(12) United States Patent
Slovin et al.

(10) Patent No.: US 10,833,259 B2
(45) Date of Patent: Nov. 10, 2020

(54) METHOD OF MANUFACTURING PHASE-CHANGE MATERIAL (PCM) RADIO FREQUENCY (RF) SWITCH USING A CHEMICALLY PROTECTIVE AND THERMALLY CONDUCTIVE LAYER

(71) Applicant: Newport Fab, LLC, Newport Beach, CA (US)

(72) Inventors: Gregory P. Slovin, Irvine, CA (US); Nabil El-Hinnawy, Irvine, CA (US); David J. Howard, Irvine, CA (US); Jefferson E. Rose, Hawthorne, CA (US)

(73) Assignee: Newport Fab, LLC, Newport Beach, CA (US)

(*) Notice: Subject to any disclaimer, the term of this patent is extended or adjusted under 35 U.S.C. 154(b) by 0 days.

(21) Appl. No.: 16/554,492

(22) Filed: Aug. 28, 2019

(65) Prior Publication Data

US 2020/0058853 A1 Feb. 20, 2020

Related U.S. Application Data

(60) Division of application No. 16/163,881, filed on Oct. 18, 2018, which is a continuation-in-part of
(Continued)

(51) Int. Cl.
*H01L 45/00* (2006.01)

(52) U.S. Cl.
CPC .......... *H01L 45/06* (2013.01); *H01L 45/1286* (2013.01); *H01L 45/1293* (2013.01); *H01L 45/141* (2013.01); *H01L 45/1608* (2013.01)

(58) Field of Classification Search
CPC ................ H01L 2924/00; H01L 45/06; H01L 2924/0002; H01L 45/1233; H01L 45/144
See application file for complete search history.

(56) References Cited

U.S. PATENT DOCUMENTS 9,257,647 B2   2/2016   Borodulin
9,368,720 B1   6/2016   Moon
(Continued)

FOREIGN PATENT DOCUMENTS

WO   WO 2016/028362   2/2016

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.
(Continued)

*Primary Examiner* — Tony Tran
(74) *Attorney, Agent, or Firm* — Farjami & Farjami LLP

(57) ABSTRACT

A radio frequency (RF) switch includes a heating element, an aluminum nitride layer situated over the heating element, and a phase-change material (PCM) situated over the aluminum nitride layer. An inside segment of the heating element underlies an active segment of the PCM, and an intermediate segment of the heating element is situated between a terminal segment of the heating element and the inside segment of the heating element. The aluminum nitride layer situated over the inside segment of the heating element provides thermal conductivity and electrical insulation between the heating element and the active segment of the PCM. The aluminum, nitride layer extends into the intermediate segment of the heating element and provides chemical protection to the intermediate segment of the heating element, such that the intermediate segment of the heating element remains substantially unetched and with substantially same thickness as the inside segment.

16 Claims, 11 Drawing Sheets

Related U.S. Application Data application No. 16/103,490, filed on Aug. 14, 2018, now Pat. No. 10,476,001, and a continuation-in-part of application No. 16/103,646, filed on Aug. 14, 2018, now Pat. No. 10,475,993, and a continuation-in-part of application No. 16/114,106, filed on Aug. 27, 2018, now Pat. No. 10,707,125.

(56) References Cited

U.S. PATENT DOCUMENTS

| | | |
|---|---|---|
| 9,601,545 B1 | 3/2017 | Tu |
| 9,917,104 B1 | 3/2018 | Roizin |
| 10,164,608 B2 | 12/2018 | Belot |
| 10,529,922 B1 | 1/2020 | Howard |
| 2014/0191181 A1 | 7/2014 | Moon |
| 2016/0056373 A1 | 2/2016 | Goktepeli |
| 2018/0005786 A1 | 1/2018 | Navarro |

OTHER PUBLICATIONS

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

G. Slovin, et al. "AlN Barriers for Capacitance Reduction in Phase-Change RF Switches," in *IEEE Electron Device Letters*, vol. 37, No. 5, pp. 568-571, May 2016.

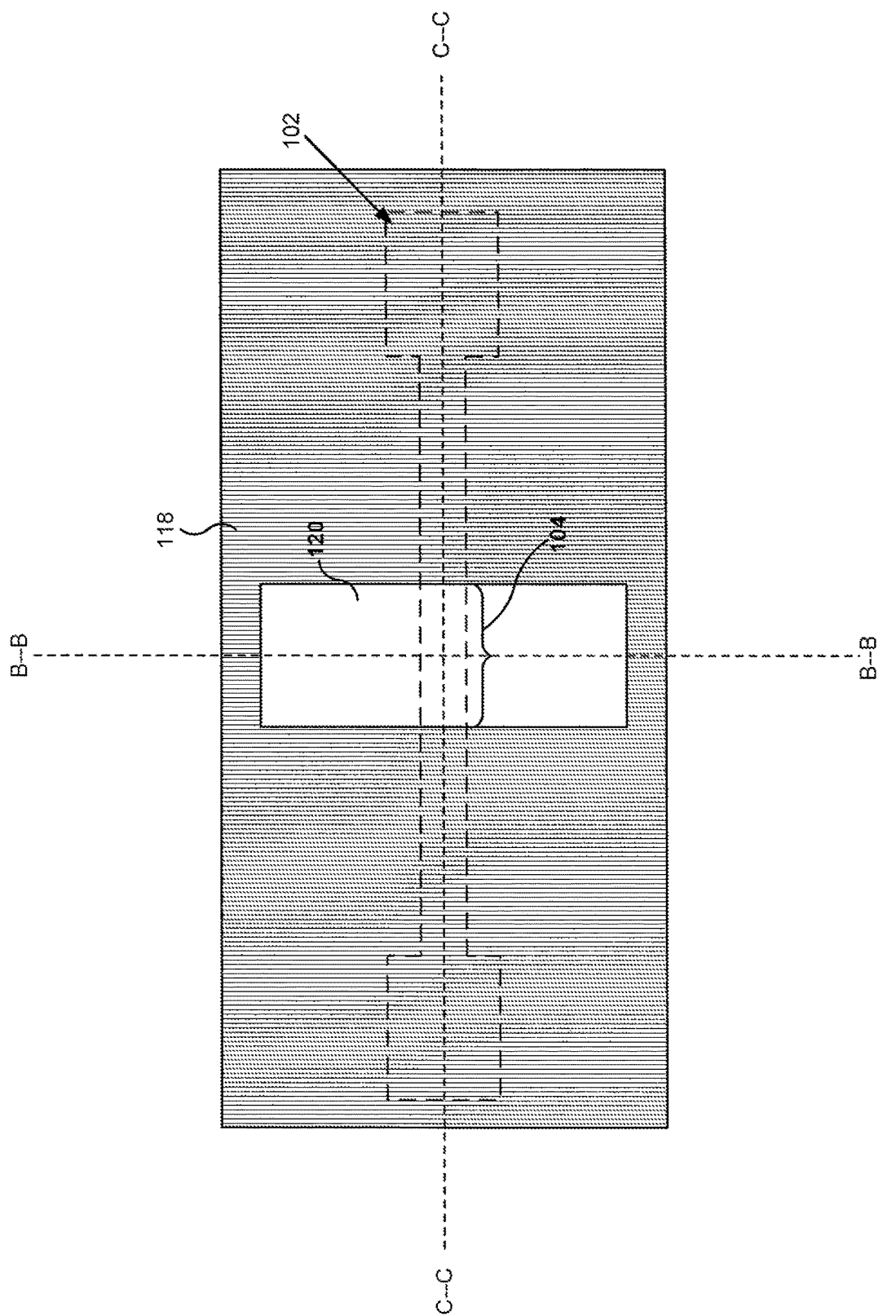

ium (700° C.) or more, and may need to cool down within hundreds of nanoseconds.

METHOD OF MANUFACTURING PHASE-CHANGE MATERIAL (PCM) RADIO FREQUENCY (RF) SWITCH USING A CHEMICALLY PROTECTIVE AND THERMALLY CONDUCTIVE LAYER

CLAIMS OF PRIORITY

This is a divisional of application Ser. No. 16/163,881 filed on Oct. 18, 2018. Application Ser. No. 16/163,881 filed on Oct. 18, 2018 ("the parent application") is a continuation-in-part of and claims the benefit of and priority to application Ser. No. 16/103,490 filed on Aug. 14, 2018, titled "Manufacturing RF Switch Based on Phase-Change Material." The parent application is also a continuation-in-part of and claims the benefit of and priority to application Ser. No. 16/103,646 filed on Aug. 14, 2018, titled "PCM RF Switch Fabrication with Subtractively Formed Heater." The parent application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element." The disclosures and contents of all of the above-identified applications are hereby incorporated fully by reference into the parent application and the present divisional application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous state, phase-change materials may need to achieve temperatures of approximately seven hundred degrees Celsius (700° C.) or more, and may need to cool down within hundreds of nanoseconds.

At such high temperatures, minor differences in PCM switch structures can have significant impacts on thermal energy management, especially in miniaturized devices. Natural process variations can ruin reliability of PCM switches by shorting them, increasing their operating voltage, or decreasing their tolerance to stress/strain. Accordingly, accommodating PCM in RF switches can present significant manufacturing challenges. Specialty manufacturing, is often impractical, and large scale manufacturing generally trades practicality for the ability to control device characteristics and critical dimensions.

Thus, there is a need in the art for highly reliable low voltage phase-change material (PCM) RF switches.

SUMMARY

The present disclosure is directed to phase-change material (PCM) radio frequency (RF) switches using a chemically protective and thermally conductive layer, substantially as shown in and/or described in connection with at least one of the figures, and as set forth in the claims.

BRIEF DESCRIPTION OF THE DRAWINGS

FIG. 3A illustrates a top view of a portion of a PCM RF switch structure processed according to an action according to one implementation of the present application.

DETAILED DESCRIPTION

Figure 1A:
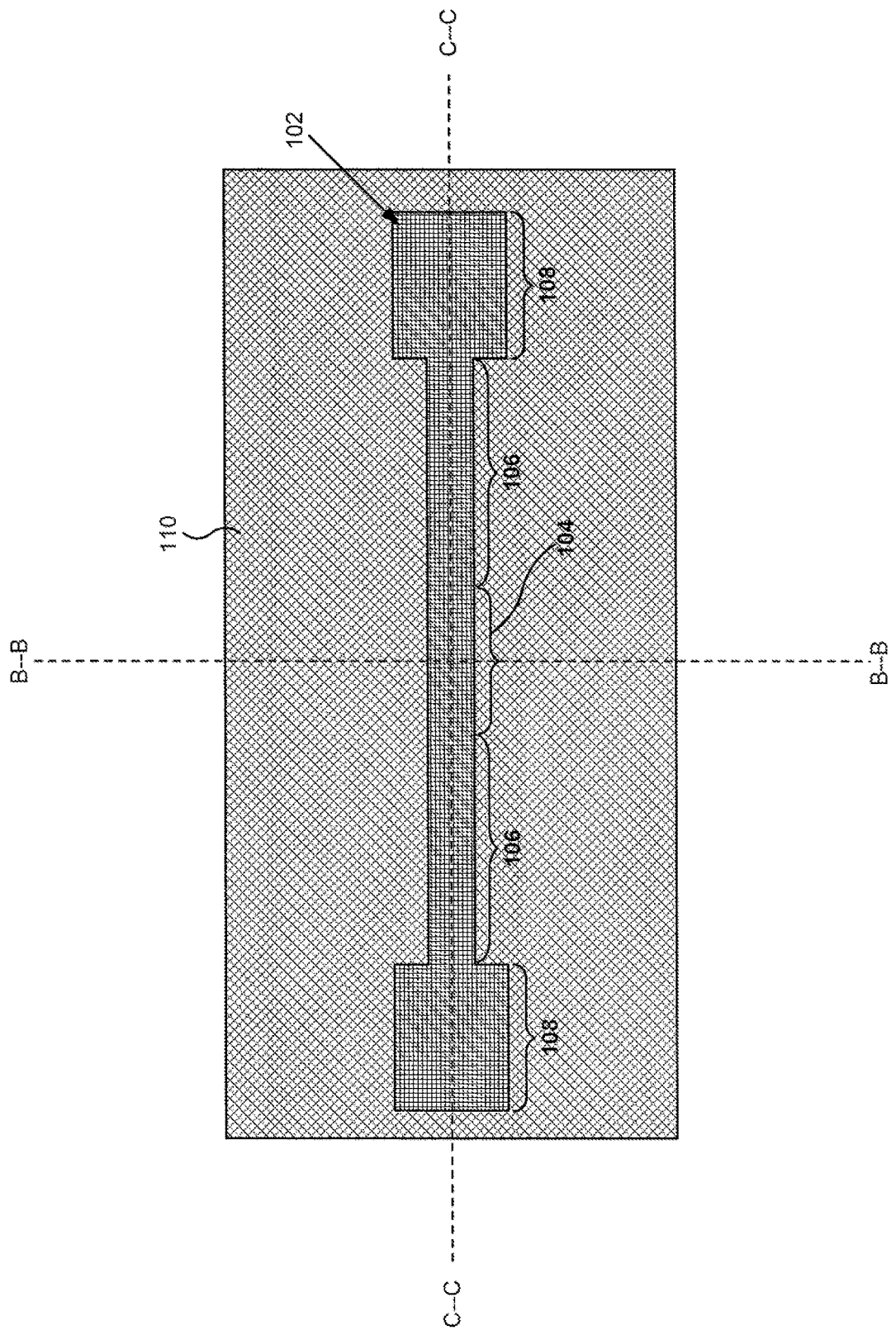
FIG. 1A illustrates a top view of a portion of a phase-change material (PCM) radio frequency (RF) switch structure processed according to an action according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1A illustrates a top view of a portion of a phase-change material (PCM) radio frequency (RF) switch structure processed according to an action according to one implementation of the present application. The PCM RF switch structure shown in FIG. 1A includes heating element 102 having inside segment 104, intermediate segments 106, and terminal segments 108, and lower dielectric 110. For purposes of illustration, the top view in FIG. 1A shows selected structures. The PCM RF switch structure may include other structures not shown in FIG. 1A.

In FIG. 1A, a heating element is provided. Heating element 102 generates a crystallizing pulse or an amorphizing pulse for transforming an active segment of PCM, as described below. Heating element 102 can comprise any material capable of Joule heating. Preferably, heating element 102 comprises a material that exhibits minimal or substantially no electromigration, thermal stress migration, and/or agglomeration. In various implementations, heating element 102 can comprise tungsten ON), molybdenum (Mo), titanium (Ti), titanium nitride (TiN), titanium tungsten (TiW), tantalum (Ta), nickel chromium (NiCr), or nickel chromium silicon (NiCrSi). Heating element 102 may be formed by a damascene process, a subtractive etch process, or any other suitable process. Lower dielectric 110 is adjacent to the sides of heating element 102. In various implementations, lower dielectric 110 is silicon oxide ($SiO_2$), silicon nitride ($Si_xN_y$), or another dielectric.

Heating element 102 extends along the PCM RF switch structure in FIG. 1A, and includes inside segment 104, intermediate segments 106, and terminal segments 108. Inside segment 104 is approximately centered along heating element 102. As used in the present application, "inside segment" refers to a segment of heating element 102 that is situated under PCM, as described below. Terminal segments 108 are situated at ends of the extension of heating element 102. In the present implementation, terminal segments 108 have a larger area than inside segment 104. In other implementations, terminal segments 108 may have any other size or shape. Terminal segments 108 provide segments where a heating element contact for heating element 102 may connect, as described below. Intermediate segments 106 are situated between inside segment 104 and terminal segments 108. In the present implementation, intermediate segments 106 are substantially continuous with inside segment 104.

Figure 1B:
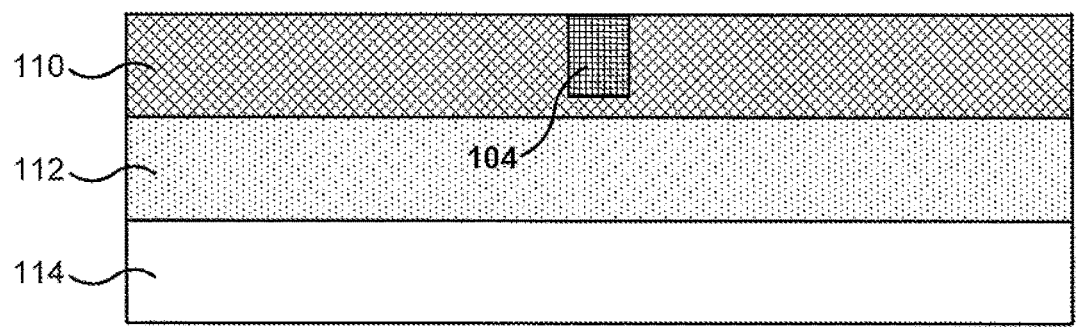
FIGS. 1B and 1C each illustrate a cross-sectional view of a portion of a PCM RF switch structure corresponding to the PCM RF switch structure of FIG. 1A according to one implementation of the present application.

FIG. 1B illustrates a cross-sectional view of a portion of a PCM RF switch structure corresponding to the PCM RF switch structure of FIG. 1A according to one implementation of the present application. FIG. 1B represents a cross-sectional view along line "B-B" in FIG. 1A. The PCM RF switch structure shown in FIG. 1B includes inside segment 104, lower dielectric 110, heat spreader 112, and substrate 114.

Lower dielectric 110 is adjacent to the sides of inside segment 104 and is substantially coplanar with inside segment 104. In the present implementation, lower dielectric 110 extends along the width of the PCM RF switch structure, and is also situated under inside segment 104. In various implementations, lower dielectric 110 can have a relative width and/or a relative thickness greater or less than shown in FIG. 1B.

Heat spreader 112 is situated under inside segment 104 and lower dielectric 110. Heat spreader 112 generally dissipates excess heat generated by a PCM RF switch. In particular, heat spreader 112 dissipates excess heat generated by heating element 102 (shown FIG. 1A) after a heat pulse, such as a crystallizing pulse or an amorphizing pulse has transformed the state of the PCM RF switch to an ON state or an OFF state. Heat spreader 112 can comprise any material with high thermal conductivity. In one implementation, heat spreader 112 can comprise a material with both high thermal conductivity and high electrical resistivity. In various implementation, heat spreader 112 can comprise silicon (Si), aluminum nitride (AlN), aluminum oxide ($Al_xO_Y$), beryllium oxide ($Be_xO_Y$), silicon carbide (SiC), diamond, or carbon.

Substrate 114 is situated under heat spreader 112 in one implementation, substrate 114 is an insulator, such as $SiO_2$. In various implementations, substrate 114 is a silicon (Si), silicon-on-insulator (SOI), sapphire, complementary metal-oxide-semiconductor (CMOS), bipolar CMOS (BiCMOS), or group III-V substrate. Substrate 114 can have additional layers not shown in FIG. 1B. In one implementation, heat spreader 112 itself performs as a substrate and a separate substrate is not used. For example, heat spreader 112 can comprise Si and be provided without substrate 114. In one implementation, heat spreader 112 can be integrated with substrate 114.

Figure 1C:
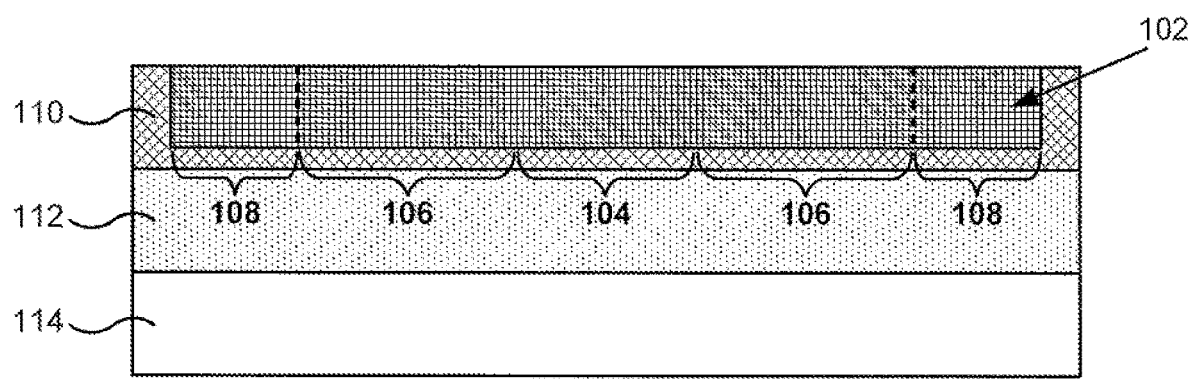

FIG. 1C illustrates a cross-sectional view of a portion of a PCM RF switch structure corresponding to the PCM RF switch structure of FIG. 1A according to one implementation of the present application. FIG. 1C represents a cross-sectional view along line "C-C" in FIG. 1A. The PCM RF switch structure shown in FIG. 1C includes heating element having inside segment 104, intermediate segments 106, and terminal segments 108, lower dielectric 110, heat spreader 112, and substrate 114.

The PCM RF switch structure in FIG. 1C is similar to the PCM RF switch structure in FIG. 1B, except that the PCM RF switch structure in FIG. 1C illustrates an entire extension of heating element 102, including inside segment 104, intermediate segments 106, and terminal segments 108, rather than just inside segment 104. Heating element 102 generates a crystallizing pulse or an amorphizing pulse for transforming an active segment of PCM, as described below. Lower dielectric 110 is adjacent to the sides of heating element 102 and is substantially coplanar with heating element 102. In the present implementation, lower dielectric 110 extends along the width of the PCM RF switch structure, and is also situated under heating element 102. Heat spreader 112 is situated under heating element 102 and lower dielectric 110. Substrate 114 is situated under heat spreader 112.

Figure 2A:
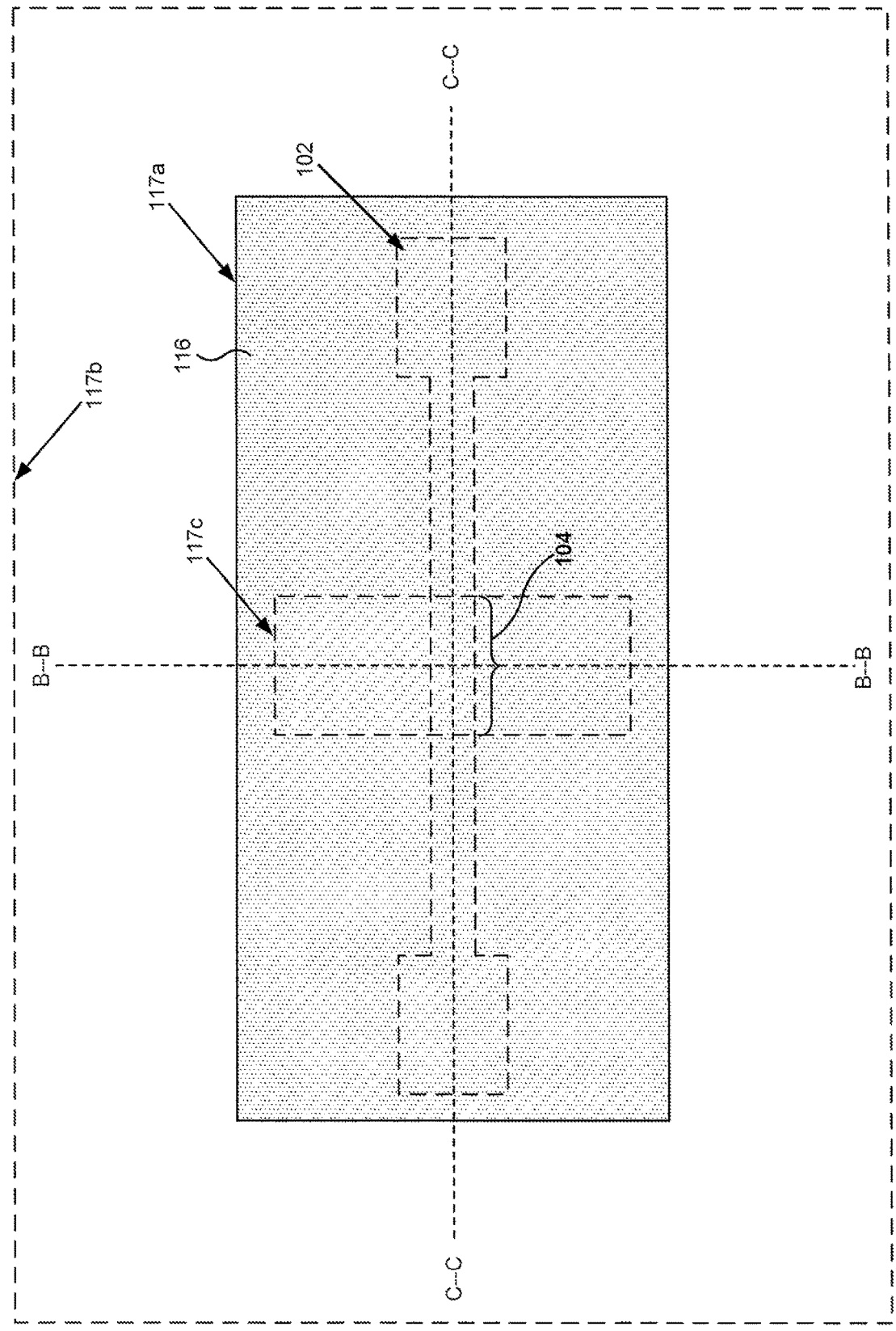
FIG. 2A illustrates a top view of a portion of a PCM RF switch structure processed according to an action according to one implementation of the present application.

FIG. 2A illustrates a top view of a portion of PCM RF switch structure processed according to an action according to one implementation of the present application. In FIG. 2A, heating element 102 is illustrated with dashed lines to indicate that it does not lie on top of the PCM RF switch structure in FIG. 2A, and is instead seen through various structures. For purposes of illustration, the top view in FIG. 2A shows selected structures. The PCM RF switch structure may include other structures not shown in FIG. 2A.

In FIG. 2A, aluminum nitride layer 116 is formed over heating element 102. Aluminum nitride layer 116 can be deposited, for example, by physical vapor deposition (PVD), chemical vapor deposition (CVD), or plasma enhanced chemical vapor deposition (PECVD). Aluminum nitride layer 116 has high thermal conductivity and high electrical resistivity. As described below, aluminum nitride layer 116 provides thermal conductivity and electrical insulation between inside segment 104 and overlying PCM (not shown in FIG. 2A) and improves both the thermal performance and the RF performance of a PCM RF switch. Aluminum nitride layer 116 also has high etch selectivity to a fluorine-based etchant. As described below, aluminum nitride layer 116 provides chemical protection to heating element 102 and improves the reliability the PCM RF switch.

As indicated by outline 117a in FIG. 2A, aluminum nitride layer 116 extends over heating element 102 and its nearby areas. In another implementation, aluminum nitride layer 116 can extend over a larger area. Outline 117b is included in FIG. 2A to indicate that aluminum nitride layer 116 can extend over a larger area, such as over an entire wafer. In another implementation, aluminum nitride layer 116 can extend over a smaller area. Outline 117c is included in FIG. 2A to indicate that aluminum nitride layer 116 can extend over a smaller area, such as over inside segment 104 and its nearby areas. Other thermally conductive and electrically insulating materials having high etch selectively to other etch chemistries can be used in place of aluminum nitride layer 116. In various implementations, aluminum oxide ($Al_xO_Y$), beryllium oxide ($Be_xO_Y$), silicon carbide (SIC), diamond, or diamond-like carbon can be used in place of aluminum nitride layer 116.

Figure 2B:
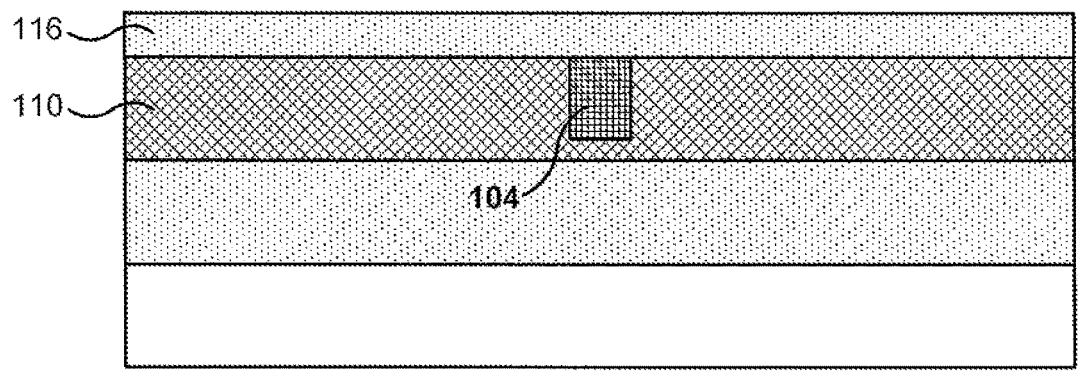
FIGS. 2B and 2C each illustrate a cross-sectional view of a portion of a PCM RF switch structure corresponding to the PCM RF switch structure of FIG. 2A according to one implementation of the present application.

FIG. 2B illustrates a cross-sectional view of a portion of a PCM RF switch structure corresponding to the PCM RF switch structure of FIG. 2A according to one implementation of the present application. FIG. 2B represents a cross-sectional view along line "B-B" in FIG. 2A.

Aluminum nitride layer 116 is situated over inside segment 104 and over lower dielectric 110, and is substantially planar. Aluminum nitride layer 116 provides thermal conductivity and electrical insulation between inside segment 104 and overlying PCM (not shown in FIG. 2B). Because aluminum nitride layer 116 has high thermal conductivity, aluminum nitride layer 116 efficiently conducts heat from a heat pulse generated by inside segment 104. Additionally, because aluminum nitride layer 116 is substantially planar and situated over inside segment 104, aluminum nitride layer 116 conducts heat from the heat pulse upward toward overlying PCM (not shown in FIG. 2B). If instead aluminum nitride layer 116 were non-planar, and were situated adjacent to sides of inside segment 104 as well as over inside segment 104, then aluminum nitride layer 116 would conduct heat from the heat pulse upward less efficiently, because heat would flow laterally from the sides of inside segment 104. In other implementations, aluminum nitride layer 116 can be non-planar. In one implementation, aluminum nitride layer 116 can have a thickness of approximately five hundred angstroms to approximately five thousand angstroms (500 Å-5000 Å). Aluminum nitride layer 116 having a thickness in this range may represent an optimization of two performance factors for a PCM RF switch, as described below.

The portion of aluminum nitride layer 1:1.6 situated over inside segment 104 can have a significantly different thermal conductivity than the portion of aluminum nitride layer 116 situated over lower dielectric 110. The different thermal conductivities can be achieved, for example, by controlling the grain size and/or crystal orientation of the aluminum nitride layer 116, or the grain size and/or crystal orientation of underlying structures. The portion of aluminum nitride layer 116 situated over inside segment 104 can be made to have thermal conductivity higher than the portion of aluminum nitride layer 116 situated over lower dielectric 110, such that aluminum nitride layer 116 increases heat flow from inside segment 104 upward in a direction toward overlying PCM (not shown in FIG. 2B), and decreases lateral heat flow from inside segment 104. In various implementations, various layers for modifying the thermal conductivity of aluminum nitride layer 116 can be introduced between inside segment 104 and aluminum nitride layer 116 and/or between lower oxide 110 and aluminum nitride layer 116.

Figure 2C:
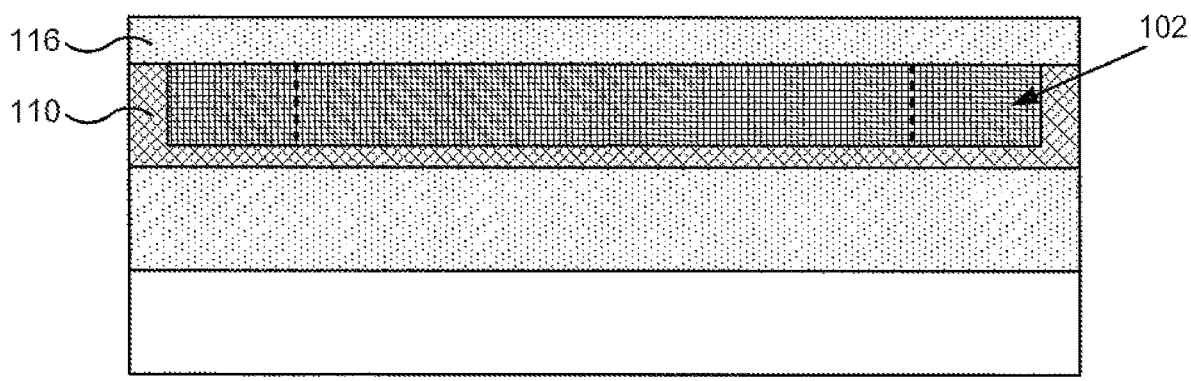

FIG. 2C illustrates a cross-sectional view of a portion of a PCM RF switch structure corresponding to the PCM RF switch structure of FIG. 2A according to one implementation of the present application. FIG. 2C represents a cross-sectional view along line "C-C" in FIG. 2A.

The PCM RF switch structure in FIG. 2C is similar to the PCM RF switch structure in FIG. 2B, except that the PCM RF switch structure in FIG. 2C illustrates an entire extension of heating element 102. Aluminum nitride layer 116 is situated over heating element 102 and over lower dielectric 110, and is substantially planar. Aluminum nitride layer 116 provides thermal conductivity and electrical insulation between heating element 102 and overlying PCM (not shown in FIG. 2C) and improves both the thermal performance and the RF performance of a PCM RF switch, as described below. Aluminum nitride layer 116 also provides chemical protection to heating element 102 and improves the reliability the PCM RF switch, as described below.

FIG. 3A illustrates a top view of a portion of PCM RF switch structure processed according to an action according to one implementation of the present application. In FIG. 3A, heating element 102 is illustrated with dashed lines to indicate that it does not lie on top of the PCM RF switch structure in FIG. 3A, and is instead seen through various structures. For purposes of illustration, the top view in FIG. 3A shows selected structures. The PCM RF switch structure may include other structures not shown in FIG. 3A.

In FIG. 3A, PCM 118 is formed over aluminum nitride layer 116 (shown in FIG. 2A), and mask 120 is formed over PCM 118 overlying inside segment 104 of heating element 102. In response to a crystallizing or an amorphizing heat pulse generated by heating element 102, PCM 118 can transform from a crystalline phase that easily conducts electrical current to an amorphous phase that does not easily conduct electrical current, and thus, can transform the state of a PCM RF switch to an ON state or an OFF state. PCM 118 can be germanium telluride ($Ge_XTe_Y$), germanium antimony telluride ($Ge_XSb_YTe_Z$), germanium selenide ($Ge_XSe_Y$), or any other chalcogenide. In various implementations, PCM 118 can be germanium telluride having from forty percent to sixty percent germanium by composition (i.e., $G_XTe_Y$, where $0.4 \leq X \leq 0.6$ and $Y=1-X$). The material for PCM 118 can be chosen based upon ON state resistivity, OFF state electric field breakdown threshold, crystallization temperature, melting temperature, or other considerations. PCM 118 can be deposited, for example, by PVD sputtering, CVD, evaporation, or atomic layer deposition (ALD). Mask 120 determines a maximum channel area of a PCM RF switch, and a maximum separation of PCM contacts (not shown in FIG. 3A).

Figure 3B:
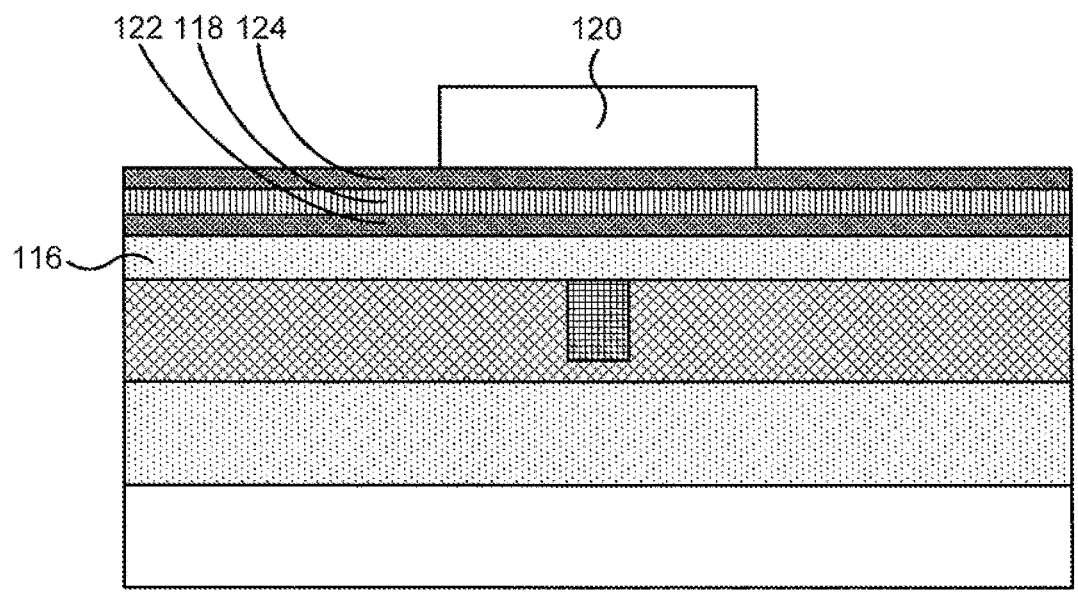
FIGS. 3B and 3C each illustrate a cross-sectional view of a portion of a PCM RF switch structure corresponding to the PCM RF switch structure of FIG. 3A according to one implementation of the present application.

FIG. 3B illustrates a cross-sectional view of a portion of a PCM RF switch structure corresponding to the PCM RF switch structure of FIG. 3A according to one implementation of the present application. FIG. 3B represents a cross-sectional view along line "B-B" in FIG. 3A.

Optional conformability support layer 122 is situated over aluminum nitride layer 116. Optional conformability support layer 122 is a homogenous layer that allows PCM 118 to be formed substantially uniform with respect to that layer. In various implementations, optional conformability support layer 122 comprises $SiO_2$ and/or $Si_XN_Y$. Optional conformability support layer 122 can be formed, for example, by PECVD or HDP-CVD. In one implementation, optional conformability support layer 122 can have a thickness of approximately fifty angstroms to approximately five hundred angstroms (50 Å-500 Å).

PCM 118 is situated over optional conformability support layer 122 (in case optional conformability support layer 122 is utilized) and over aluminum nitride layer 116. As shown in FIG. 3B, because aluminum nitride layer 116 is substantially planar, PCM 118 is also substantially planar. In other implementations, aluminum nitride layer 116 can be non-planar. In one implementation, PCM 118 can have a thickness of approximately five hundred angstroms to approximately two thousand angstroms (500 Å-2000 Å). In other implementations, PCM 118 can have any other thicknesses. The thickness of PCM 118 can be chosen based upon sheet resistance, crystallization power, amorphization power, or other considerations.

Optional contact uniformity support layer 124 is situated over PCM 118. Optional contact uniformity support layer 124 allows PCM 118 to remain substantially intact during formation of PCM contacts (not shown in FIG. 3B), as described below. In various implementations, optional contact uniformity support layer 124 comprises $SiO_2$ and/or $Si_XN_Y$. Optional contact uniformity support layer 124 can be formed, for example, by PECVD or HDP-CVD. In one implementation, optional contact uniformity support layer 124 can have a thickness of approximately fifty angstroms to approximately two thousand angstroms (50 Å-2000 Å).

Mask 120 is formed over optional contact uniformity support layer 124 (in case optional contact uniformity support layer 124 is utilized) and over PCM 118. Mask 120 determines a maximum channel area of a PCM RF switch, and a maximum separation of PCM contacts (not shown in FIG. 3A).

Figure 3C:
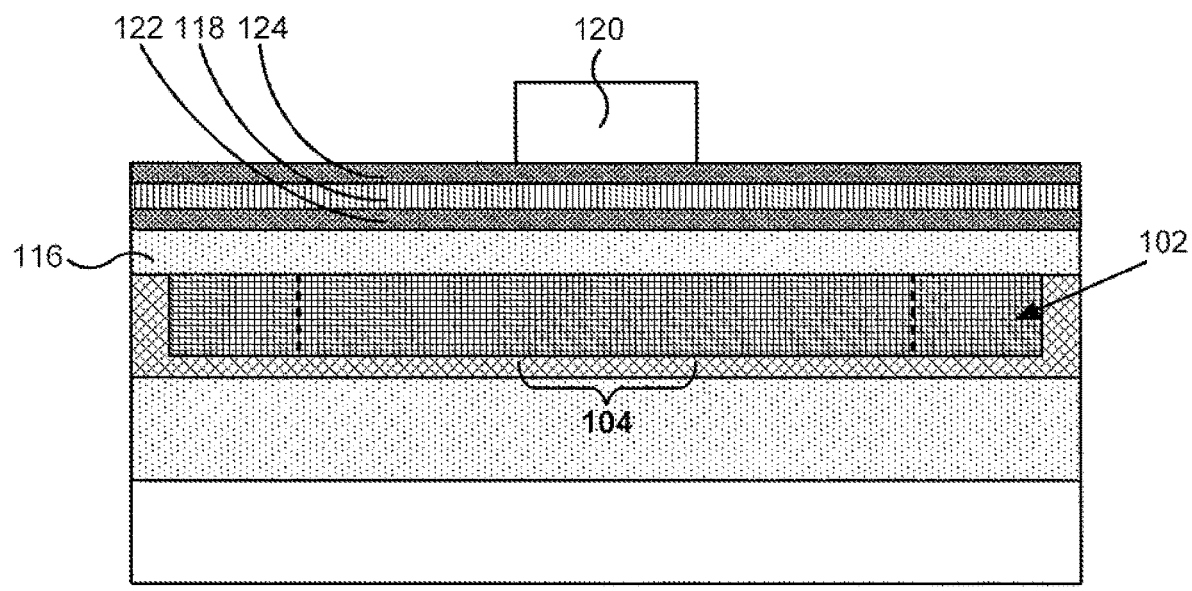

FIG. 3C illustrates a cross-sectional view of a portion of a PCM RF switch structure corresponding to the PCM RF switch structure of FIG. 3A according to one implementation of the present application. FIG. 3C represents a cross-sectional view along line "C-C" in FIG. 3A.

The PCM RF switch structure in FIG. 3C is similar to the PCM RF switch structure in FIG. 3B, except that the PCM RF switch structure in FIG. 3C illustrates an entire extension of heating element 102. Optional conformability support layer 122, substantially planar PCM 118, optional contact uniformity support layer 124, and mask 120 are subsequently situated over aluminum nitride layer 116. As shown in FIG. 3C, mask 120 is substantially aligned with inside segment 104 of heating element 102.

Figure 4A:
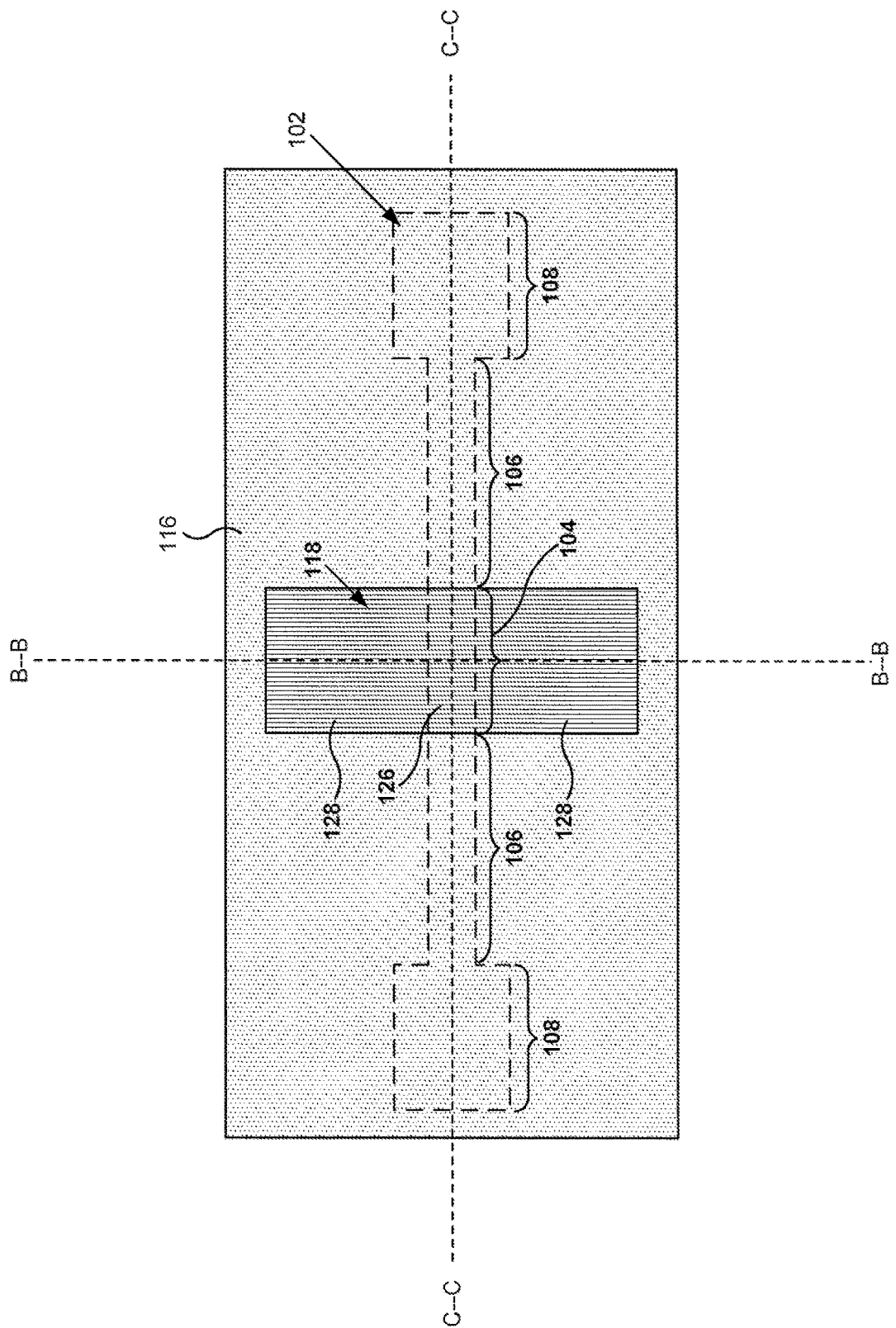
FIG. 4A illustrates a top view of a portion of a PCM RF switch structure processed according to an action according to one implementation of the present application.

FIG. 4A illustrates a top view of a portion of PCM RF switch structure processed according to an action according to one implementation of the present application. In FIG. 4A, heating element 102 is illustrated with dashed lines to indicate that it does not lie on top of the PCM RF switch structure in FIG. 4A, and is instead seen through various structures. For purposes of illustration, the top view in FIG. 4A shows selected structures. The PCM RF switch structure may include other structures not shown in FIG. 4A.

In FIG. 4A, PCM 118 is defined and mask 120 (shown in FIG. 3A) is removed. Heating element 102 extends transverse to PCM 118. PCM 118 includes active segments 126 and passive segments 128. As used herein, "active segment" refers to a segment of PCM that transforms between crystalline and amorphous states, for example, in response to heat pulses, whereas "passive segment" refers to a segment of PCM that does not make such transformation and maintains a crystalline state (i.e. maintains a conductive state). Active segment 126 of PCM 118 overlies inside segment 104 of heating element 102. Intermediate segments 106 of heating element 102 are situated between terminal segments 108 and inside segment 104. Aluminum nitride layer 116 is situated over heating element 102 and under PCM 118.

Figure 4B:
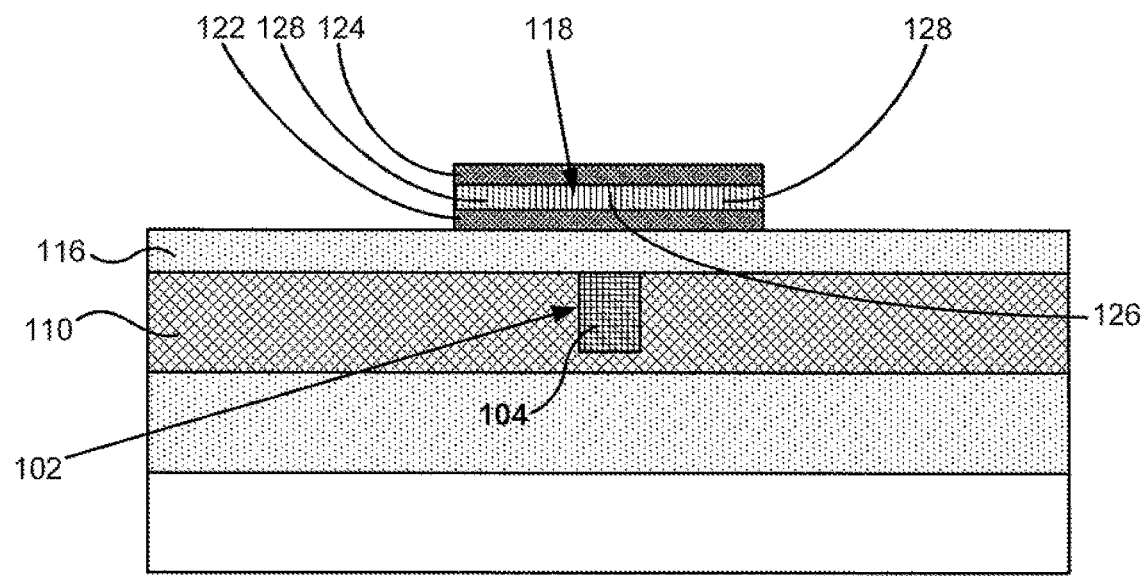
FIGS. 4B and 4C each illustrate a cross-sectional view of a portion of a PCM RF switch structure corresponding to the PCM RF switch structure of FIG. 4A according to one implementation of the present application.

FIG. 4B illustrates a cross-sectional view of a portion of a PCM RF switch structure corresponding to the PCM RF switch structure of FIG. 4A according to one implementation of the present application. FIG. 4B represents a cross-sectional view along line "B-B" in FIG. 4A.

Portions of optional conformability support layer 122, PCM 118, and optional contact uniformity support layer 124 are removed in the regions outside of mask 120 (shown in FIG. 3B). As a result, inside segment 104 of heating element 102 underlies active segment 126 of PCM 118, and passive segments 128 of PCM 118 extend outward from active segment 126. In contrast, portions of aluminum nitride layer 116 are not removed in the regions outside of mask 120 (shown in FIG. 3B). In one implementation, a fluorine-based plasma dry etch is used to selectively etch optional conformability support layer 122, PCM 118, and optional contact uniformity support layer 124, and aluminum nitride layer 116 performs as an etch stop. In this implementation, using a fluorine-based plasma dry etch may be preferable since the etch rate of PCM 118 in fluorine-based etchants is significantly higher than the etch rate of aluminum nitride layer 116 in fluorine-based etchants. However, any other technique may be used to form optional conformability support layer 122, PCM 118, and optional contact uniformity support layer 124 as shown in FIG. 4B, as long as aluminum nitride layer 116 provides chemical protection to underlying structures of the PCM RF switch structure in FIG. 4B.

Continuing by referring to FIG. 4B, it is shown that planarity of lower dielectric 110 and aluminum nitride layer 116, causes conformability support layer 122, PCM 118, and contact uniformity support layer 124 to be also planar. In particular, PCM 118 assumes a planar, i.e. a flat, configuration. If lower dielectric 110 and aluminum nitride layer 116 were not planar and were conformally formed over heating element 102, each layer, for example, lower dielectric 110 and aluminum nitride layer 116, would assume the shape of the topography under it, resulting in an uneven shape, e.g., a bump, where each layer passes over heating element 102. According to the present implementation of the present application, the planar formation of lower dielectric 110 and aluminum nitride layer 116, which in turn results in planarity (i.e. flatness) of PCM 118, presents several significant advantages over implementations that are non-planar, i.e. implementations where PCM 118 assumes the uneven shape of the topography under PCM 118, for example, the bump presented by heating element 102.

First, since PCM 118 is in effect a resistor whose value should be predictably set in both the ON and OFF states of the PCM RF switch, the planar layout of PCM 118 in the PCM RF switch in FIG. 4B results in significantly improved predictability of the resistance value of PCM 118 in both the ON and OFF states. One reason is that the planar, i.e. flat, layout of PCM 118 is a substantially constant-length resistor. A non-flat topography that is conformal to topographic variations under PCM 118 (for example, a bump caused by heating element 102), results in a relatively unpredictable resistance value of PCM 118, due to the variable topography of PCM 118 resulting from a "bumpy" shape of PCM 118, and would change depending on thickness of heating element 102, the width of heating element 102 (resulting in different heights for step coverage), and the thickness of the layers formed between heating element 102 and PCM 118, as well as process variations and variations in step coverage in those layers. These variations and unpredictabilities are substantially eliminated by the planar configuration of PCM 118 shown in the PCM RF switch in FIG. 4B.

Second, the planar PCM RF switch, such as that shown in FIG. 4B, is mechanically more reliable and has a higher mechanical integrity relative to non-planar implementations. In a non-planar configuration, the mechanical reliability and integrity of PCM 118 is adversely affected. For example, there would be increased likelihood of cracks and voids due to a non-planar configuration. Further, as the number of ON/OFF electrical cyclings during operation of the PCM RF switch increases, so does the likelihood for crack and void formation due to the associated thermal cyclings and thermal stress and the resulting non-uniform expansion and contraction of the non-planar layers, and in particular the non-planar PCM.

Third, the planar PCM RF switch, such as that shown in FIG. 4B, maintains a more predictable electrical performance and an improved reliability. In non-planar configurations of PCM in a PCM. RF switch, current crowding can occur, for example, in the corners or in the steps existing in the non-planar topography, which would lead to unpredictable degradation and variations in electrical performance, and also potential reliability problems.

Fourth, the planar PCM RF switch, such as that shown in FIG. 4B, results in improved reliability due to reduction or elimination of non-uniform heating of the PCM. In non-planar topologies, the current crowding effect referred to above can result in non-uniform heating in the PCM. The non-uniform heating can lead to early failure or a less robust switch depending on the applied voltage or the power level experienced by the PCM RF switch. As such, the voltage and power operational range of the PCM RF switch would have to be limited, relative to the planar PCM RF switch, such as that shown in FIG. 4B—which can operate in a wider range of voltage and power.

Figure 4C:
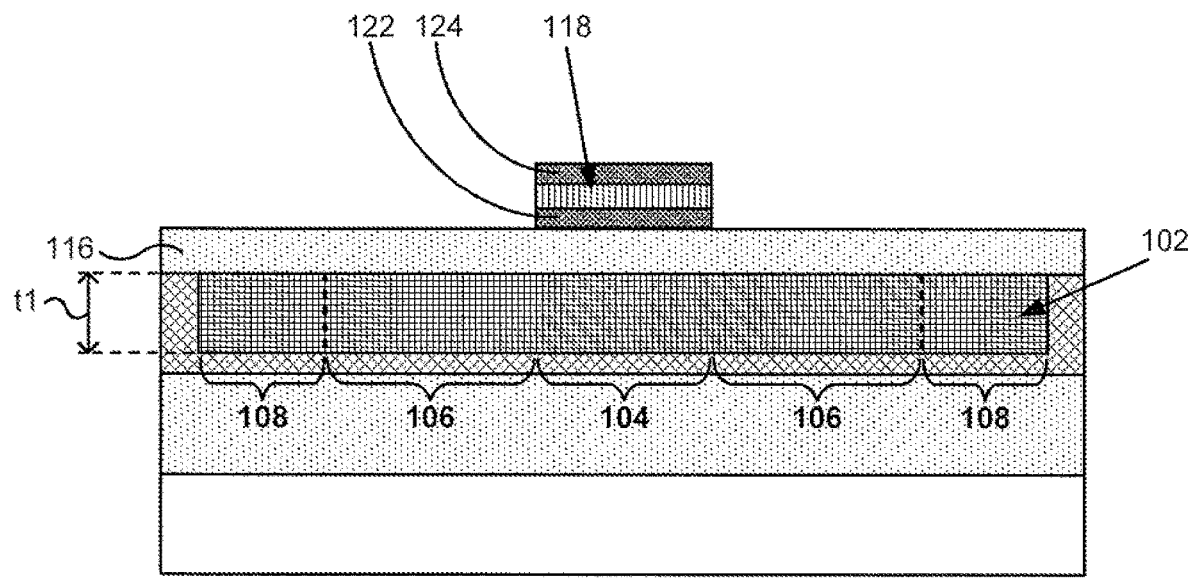

FIG. 4C illustrates a cross-sectional view of a portion of a PCM RF switch structure corresponding to the PCM RF switch structure of FIG. 4A according to one implementation of the present application. FIG. 4C represents a cross-sectional view along line "C-C" in FIG. 4A.

The PCM RF switch structure in FIG. 4C is similar to the PCM RF switch structure in FIG. 4B, except that the PCM RF switch structure in FIG. 4C illustrates an entire extension of heating element 102, including inside segment 104, intermediate segments 106, and terminal segments 108. Portions of optional conformability support layer 122, PCM 118, and optional contact uniformity support layer 124 are removed in the regions outside of mask 120 (shown in FIG. 3C). As a result, inside segment 104 of heating element 102 underlies. PCM 118. In contrast, portions of aluminum nitride layer 116 are not removed in the regions outside of mask 120 (shown in FIG. 3C). As described above, aluminum nitride layer 116 provides chemical protection to underlying structures of the PCM RF switch structure in FIG. 4C while optional conformability support layer 122, PCM 118, and optional contact uniformity support layer 124 are formed. In particular, aluminum nitride layer 116 provides chemical protection to intermediate segments 106 and terminal segments 108 of heating element 102, which would not be protected by mask 120 (shown in FIG. 3C). Thus, intermediate segments 106 and terminal segments 108 of heating element 102 remain substantially unetched and with substantially same thickness as said inside segment 104. As shown in FIG. 4C, inside segment 104, intermediate segments 106, and terminal segments 108 all have thickness t1, and their top surfaces remain, planar and unetched.

Figure 5:
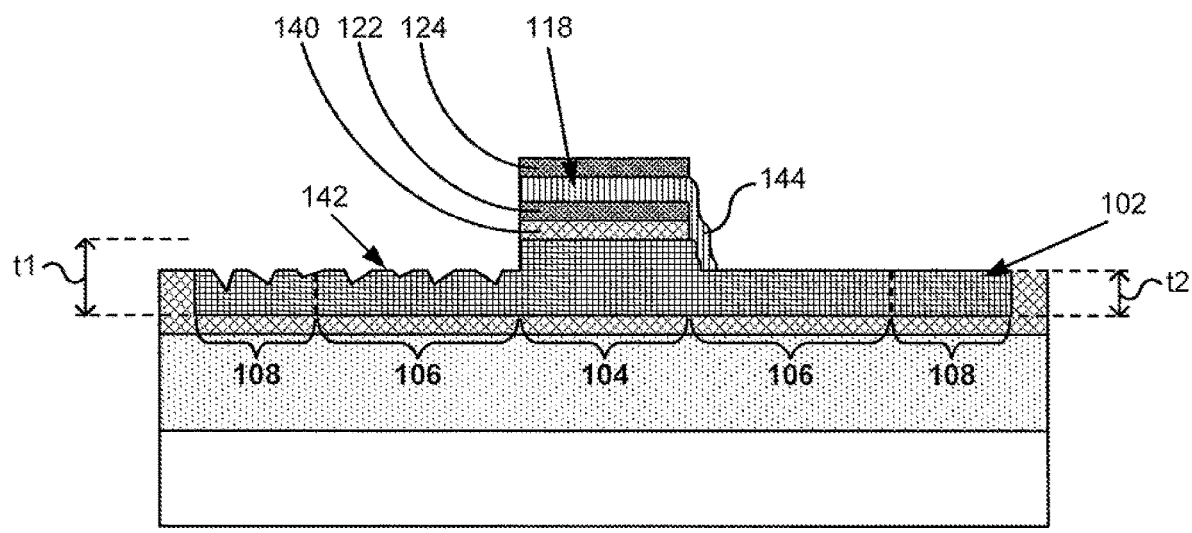
FIG. 5 illustrates a cross-sectional view of a portion of a PCM RF switch structure processed according to an alternate implementation of the present application.

FIG. 5 illustrates a cross-sectional view of a portion of a PCM RF switch structure processed according to an alternate implementation of the present application. The PCM RF switch structure in FIG. 5 represents an alternate implementation of the PCM RF switch structure in FIG. 4C, wherein non-protective dielectric 140 is used instead of aluminum nitride layer 116. Non-protective dielectric 140 provides electrical insulation between inside segment 104 and overlying PCM 118, and may or may not have high thermal conductivity. However, non-protective dielectric 140 does not provide chemical protection underlying structures when portions of optional conformability support layer 122, PCM 118, and optional contact uniformity support layer 124 are removed in the regions outside of mask 120 (shown in FIG. 3C). Non-protective dielectric 140 can have low etch selectivity to a fluorine-based etchant. In various implementations, non-protective dielectric 140 is $SiO_2$, $Si_XN_Y$, or another dielectric. In one implementation, non-protective dielectric 140 can have a thickness of approximately three hundred angstroms to approximately one thousand angstroms (300 Å-1000 Å). In FIG. 5, when portions of optional conformability support layer 122, PCM 118, and optional contact uniformity support layer 124 are removed in the regions outside of mask 120 (shown in FIG. 3C), corresponding portions of non-protective dielectric 140 are also removed, and several defects or faults can occur.

First, intermediate segments 106 and terminal segments 108 of heating element 102 can become undesirably etched. For example, fluorine-based etchants that etch through PCM 118 and non-protective dielectric 140 can also etch through a tungsten heating element. It may not be possible to accurately time the etching process to stop precisely at the top surface of heating element 102. As shown in FIG. 5, intermediate segments 106 and terminal segments 108 are undesirably etched. In contrast, inside segment 104 of heating element 102 is substantially unetched. Thus, intermediate segments 106 and terminal segments 108 have thickness t2, which is less than thickness t1 of inside segment 104. Because heating element 102 requires high currents to generate heat pulses, heating element 102 is particularly sensitive to variations in thickness. Thinner intermediate segments 106 will heat significantly more than thicker inside segment 104. The increased heat of thinner intermediate segments 106 represents wasted power, since the heat of inside segment 104 primarily transforms PCM 118. Heating element 102 will require much higher applied pulse power in order for inside segment 104 to transform PCM 11$. Furthermore, if intermediate segments 106 overheat, heating element 102 can become permanently damaged and the PCM RF switch may fail to function.

Second, depending on the techniques used to define optional conformability support layer 122, PCM 118, and optional contact uniformity support layer 124, heating element 102 can be damaged. As shown in FIG. 5, damaged surface 142 can occur when non-protective dielectric 140 is used instead of aluminum nitride layer 116, Damaged surface 142 causes heating element 102 to heat unevenly due variations in thickness. Damaged surface 142 weakens heating element 102, allowing it to break more easily. Damaged surface 142 also makes it difficult to uniformly contact terminal segments 108 with heating element contacts (not shown in FIG. 5).

Third, the PCM RF switch can short. For example, a natural result of etching PCM 118 using fluorine-based etchants is that stringers, such as stringer 144, will form at an edge of PCM 118. Stringer 144 can couple to heating element 102 and cause a short. PCM 118, which should be conducting an RF signal, would be undesirably electrically connected to heating element 102, which should be conducting a joule heating current, which would result in a major fault in the PCM RF switch function and operation.

Figure 6A:
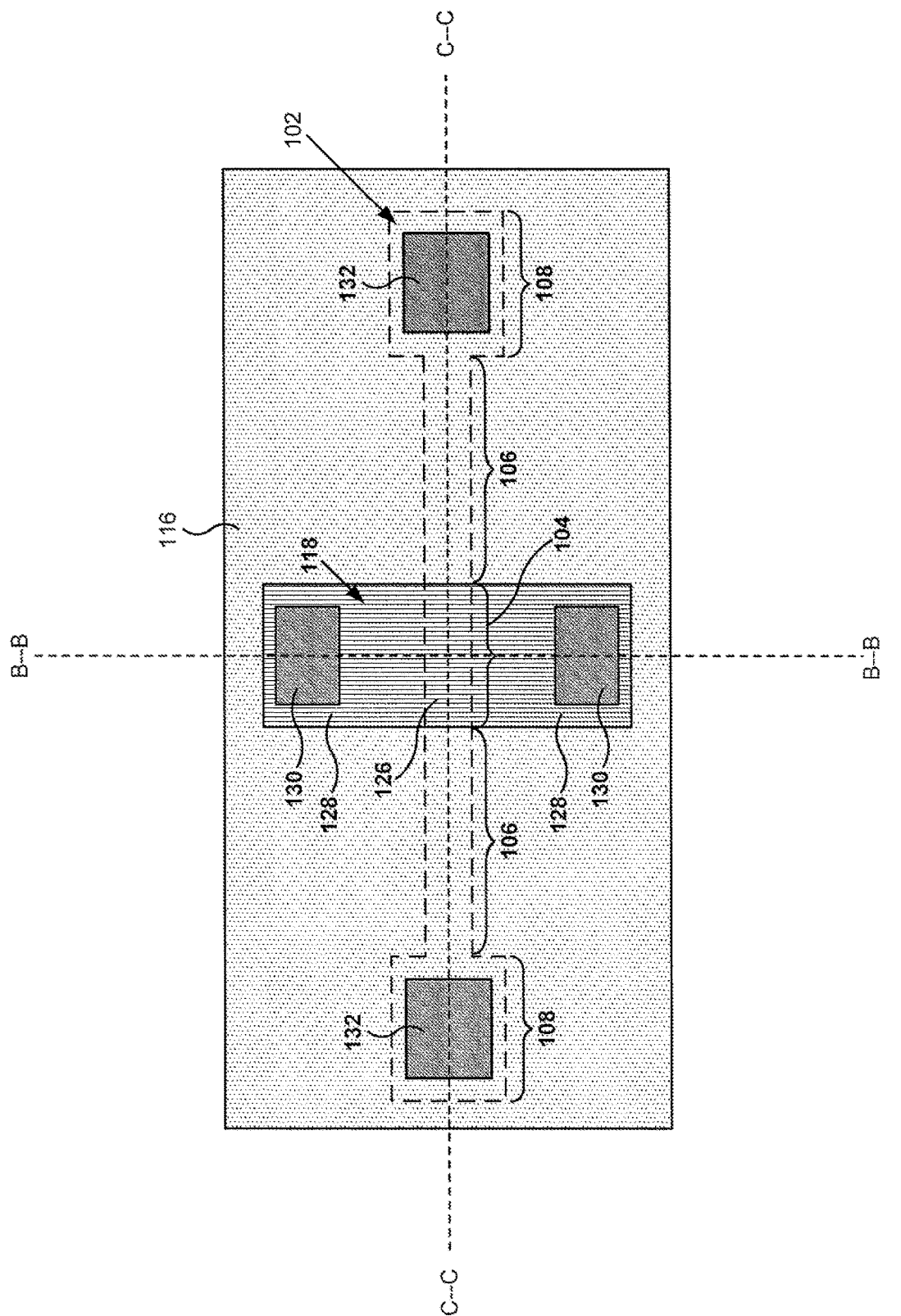
FIG. 6A illustrates a top view of a portion of a PCM RF switch structure processed according to an action according to one implementation of the present application.

FIG. 6A illustrates a top view of a portion of PCM RF switch structure processed according to an action according to one implementation of the present application. In FIG. 6A, heating element 102 is illustrated with dashed lines to indicate that it does not lie on top of the PCM RF switch structure in FIG. 6A, and is instead seen through various structures. For purposes of illustration, the top view in FIG. 6A shows selected structures. The PCM RF switch structure may include other structures not shown in FIG. 6A.

In FIG. 6A, PCM contacts 130 are formed over passive segments 128 of PCM 118, and heating element contacts 132 are formed over terminal segments 108 of heating element 102. In various implementations, input/output contacts 352 can comprise tungsten (W), copper (Cu), aluminum (Al), titanium (Ti), titanium nitride (TiN), or other metals. FIG. 6A also illustrates active segment 126 of PCM 118 situated over inside segment 104 of heating element 102, intermediate segments 106 of heating element 102 extending between inside segment 104 and terminal segments 108, and aluminum nitride layer 116 situated over heating element 102 and under PCM 118.

Figure 6B:
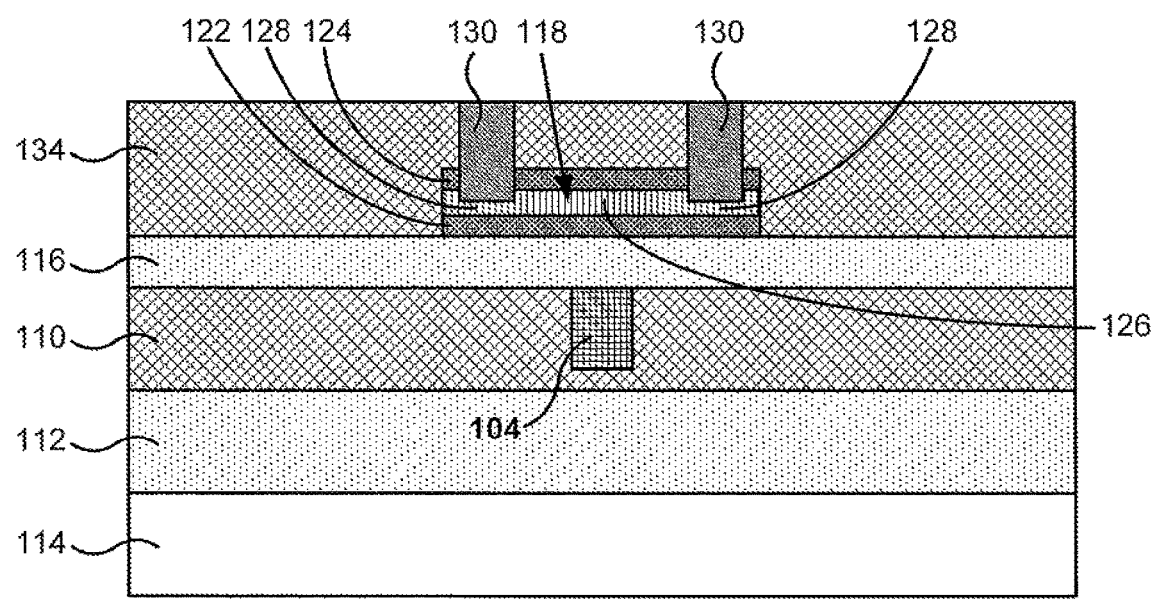
FIGS. 6B and 6C each illustrate a cross-sectional view of a portion of a PCM RF switch structure corresponding to the PCM RF switch structure of FIG. 6A according to one implementation of the present application.

FIG. 6B illustrates a cross-sectional view of a portion of a PCM RF switch structure corresponding to the PCM RF switch structure of FIG. 4A according to one implementation of the present application. FIG. 6B represents a cross-sectional view along line "B-B" in FIG. 6A.

PCM contacts 130 are situated in contact dielectric 134 and over passive segments 128 of PCM 118. In this implementation, forming PCM contacts 130 may comprise two different etching actions. In the first etching action, contact dielectric 134 can be aggressively etched to form most of the PCM contact holes. This first etching action can use a selective etch, and optional contact uniformity support layer 124 can perform as an etch stop. In the second etching action, optional contact uniformity support layer 124 can be etched less aggressively. As a result, PCM 118 will remain substantially intact, and PCM contacts 130 can uniformly contact PCM 118. Notably, because PCM 118 is planar, uniformly contacting PCM 118 using PCM contacts 130 is simplified. Because the $R_{ON}$ of a PCM RF switch depends heavily on the uniformity of contacts made with PCM 118, the $R_{ON}$ will be significantly lower when optional contact uniformity support layer 124 is used in one implementation, optional contact uniformity support layer 124 is substantially thinner than contact dielectric 134.

Aluminum nitride layer 116 has high thermal conductivity and is able to provide several advantages. First, because aluminum nitride layer 116 has high thermal conductivity, aluminum nitride layer 116 efficiently conducts heat from a heat pulse generated by inside segment 104. Additionally, where aluminum nitride layer 116 is substantially planar and situated over inside segment 104, aluminum nitride layer 116 conducts heat from the heat pulse upward toward overlying PCM 118. This improved heat transfer allows active segment 126 of PCM 118 to transform at a lower applied pulse power, and allows the PCM RF to switch between ON sand OFF states at a lower applied pulse power.

Second, this improved heat transfer decreases stresses and strains in the switch. Because lower applied pulse powers can be used, less thermal expansion occurs in heating element 102. This reduces thermal expansion stresses and strains in the switch, thereby improving reliability.

Third, this improved heat transfer also transforms more PCM 118, increasing the size of active region 126. This increased size of active region increases the breakdown voltage of the PCM RF switch in the OFF state. In one implementation, the breakdown voltage of the PCM RF switch structure in FIG. 6B may be double the breakdown voltage of the PCM RF switch structure FIG. 5.

Fourth, aluminum nitride layer 116 also efficiently transfers heat generated by PCM 118 away from PCM 118. In the ON state, when active segment 128 of PCM 118 is in a crystalline state, the PCM RF switch structure in FIG. 6B propagates an RF signal between PCM contacts 130 through PCM 118. PCM 118 generates heat from Joule heating when the RF signal propagates through PCM 118. Aluminum nitride layer 116 efficiently transfers this heat away. This improved heat transfer allows the switch to operate at a lower steady-state temperature, making the switch suitable for hot-switching applications and higher power handling applications.

Aluminum nitride layer 116 also has high electrical resistivity and is able to provide several advantages. First, the added electrical insulation of aluminum nitride layer 116 reduces parasitic capacitive coupling between PCM contacts 130 and inside segment 104 and/or between PCM 118 and inside segment 104, thereby reducing a total insertion loss of the switch in the ON state and reducing a total OFF state parasitic capacitance ($C_{OFF}$) of the switch in the OFF state. Thicker aluminum nitride layer 116 will reduce parasitic capacitive coupling, but will also increase the applied pulse power required to transform active region 126 of PCM 118. However, beyond a certain thickness, aluminum nitride layer 116 sees diminishing advantage with regard to parasitic capacitive coupling. Beyond a certain thickness, the applied pulse power required to transform active region 126 of PCM 118 will continue to increase, but the parasitic capacitive coupling between PCM contacts 130 and inside segment 104 and/or between PCM 118 and inside segment 104 will only minimally reduce or will substantially not reduce. Thus, the thickness of aluminum nitride layer 116 can be selected based on an optimization of two performance factors for the PCM RF switch.

Second, aluminum nitride layer 116 decreases the chance an RF signal will shunt. In the ON state, an RF signal can leak from PCM contacts 130 through PCM 118 to inside segment 104, which may provide an electrical path to ground through pulsing circuitry (not shown in FIG. 6B) and/or substrate 114. The added electrical insulation of aluminum nitride layer 116 reduces the chance an RF signal will shunt. Additionally, where PCM 118 is substantially planar, the signal path between PCM contacts 130 is direct, and the chance an RF signal will shunt is further reduced.

Figure 6C:
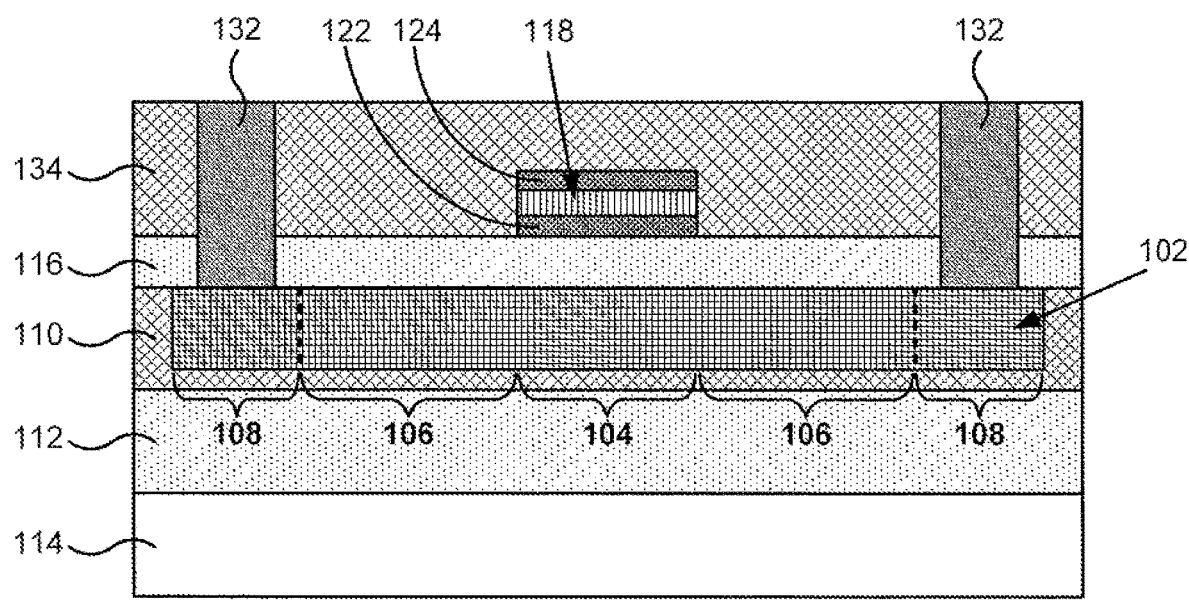

FIG. 6C illustrates a cross-sectional view of a portion of a PCM RF switch structure corresponding to the PCM RF switch structure of FIG. 6A according to one implementation of the present application. FIG. 6C represents a cross-sectional view along line "C-C" FIG. 6A.

Heating element contacts 132 are situated in contact dielectric 134 and over terminal segments 108 of heating element 102. In this implementation, forming heating element contacts 132 may comprise two different etching actions. In the first etching action, contact dielectric 134 can be aggressively etched to form most of the heating element contact holes. This first etching action can use a selective etch, example, a fluorine-based plasma dry etch, and aluminum nitride layer 116 can perform as an etch stop. In the second etching action, aluminum nitride layer 116 can be etched less aggressively, for example, using chlorine-based plasma dry etch. As a result, terminal segments 108 of heating element 102 will remain substantially unetched and with substantially the same thickness as intermediate segments 106 and inside segment 104.

In the present implementation, after heating element contacts 132 are formed, aluminum nitride layer 116 fully extends over intermediate segments 106 and partially extends over terminal segments 108 thereby providing chemical protection to both intermediate segments 106 terminal segments 108. In various implementation, aluminum nitride layer 116 fully extends over intermediate segments 106 but does not extend over terminal segments 108, or only partially extends over intermediate segments 106. For example, aluminum nitride layer 116 can provide chemical protection where heating element contacts 132 are not precisely aligned with terminal segments 108 or where heating element contacts 132 are larger than shown in FIG. 6C. In one implementation, aluminum nitride layer 116 provides chemical protection to other structures (not shown in FIG. 6C) integrated with the PCM RF switch.

Aluminum nitride, layer 116 also protects the PCM RF switch against shorting to heating element 102. As described above, a natural result of etching optional conformability support layer 122, PCM 118, and optional contact uniformity support layer 124 is that stringers, such as stringer 144 in FIG. 5, will form at an edge of PCM 118. In the PCM RF switch structure in FIG. 6C, aluminum nitride layer 116 intervenes between the edge of PCM 118 and heating element 102. Because, aluminum nitride layer 116 provides electrical insulation, stringer 144 would not couple to heating element 102 and would not cause a short.

Thus, various implementations of the present application achieve a highly reliable RF switch that overcomes the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method of manufacturing a radio frequency (RF) switch, the method comprising:
providing a heating element;
forming an aluminum nitride layer over said heating element;
forming a phase-change material (PCM) over said aluminum nitride layer such that said PCM defines an inside segment of said heating element underlying said PCM, and an intermediate segment of said heating element not underlying said PCM, said intermediate segment of said heating element situated between a terminal segment of said heating element and said inside segment of said heating element;
wherein said aluminum nitride layer at least partially extends over said intermediate segment of said heating element for providing chemical protection to said intermediate segment of said heating element;
forming a heating element contact situated over said terminal segment of said heating element, wherein said forming said heating element contact comprises using said aluminum nitride layer as an etch stop during an etching action.

2. The method of claim 1, further comprising forming a PCM contact situated over a passive segment of said PCM.

3. The method of claim 1, wherein said aluminum nitride layer prevents stringers at an edge of said PCM from coupling to said heating element.

4. The method of claim 1, wherein said aluminum nitride layer is planar.

5. The method of claim 1, wherein said aluminum nitride layer is further formed over a lower dielectric, has a first thermal conductivity over said lower dielectric, and has a second thermal conductivity over said inside segment of said heating element;
said second thermal conductivity being higher than said first thermal conductivity, such that said aluminum nitride layer increases heat flow from said heating element in a direction toward an active segment of said PCM.

6. The method of claim 1, wherein said heating element comprises material selected from the group consisting of tungsten (W), molybdenum (Mo), titanium (Ti), titanium nitride (TiN), titanium tungsten (TiW), tantalum (Ta), nickel chromium (NiCr), and nickel chromium silicon (NiCrSi).

7. The method of claim 1, wherein said phase-change material is selected from the group consisting of germanium telluride ($Ge_XTe_Y$), germanium antimony telluride ($Ge_XSb_YTe_Z$), germanium selenide ($Ge_XSe_Y$), and any other chalcogenide.

8. The method of claim 1, wherein said aluminum nitride layer has a thickness greater than or approximately equal to five hundred angstroms and less than or approximately equal to five thousand angstroms (500 Å-5,000 Å).

9. A method of manufacturing a radio frequency (RF) switch, the method comprising:
providing a heating element;
forming a chemically protective and thermally conductive layer over said heating element;
forming a phase-change material (PCM) over said chemically protective and thermally conductive layer such that said PCM defines an inside segment of said heating element underlying said PCM, and an intermediate segment of said heating element not underlying said PCM, wherein said intermediate segment of said heating element is situated between a terminal segment of said heating element and said inside segment of said heating element;
wherein said chemically protective and thermally conductive layer at least partially extends over said intermediate segment;
forming a heating element contact situated over said terminal segment of said heating element, wherein said forming said heating element contact comprises using said chemically protective and thermally conductive layer as an etch stop during an etching action.

10. The method of claim 9, wherein said chemically protective and thermally conductive layer provides chemical protection to said intermediate segment of said heating element.

11. The method of claim 9, wherein said chemically protective and thermally conductive layer comprises a material selected from the group consisting of aluminum nitride, aluminum oxide, beryllium oxide, silicon carbide, diamond, and diamond-like carbon.

12. The method of claim 9, further comprising forming a PCM contact situated over a passive segment of said PCM.

13. The method of claim 9, wherein said chemically protective and thermally conductive layer is further formed over a lower dielectric, has a first thermal conductivity over said lower dielectric, and has a second thermal conductivity over said inside segment of said heating element, wherein said second thermal conductivity is higher than said first thermal conductivity.

14. The method of claim 9, wherein said heating element comprises material selected from the group consisting of tungsten (W), molybdenum (Mo), titanium (Ti), titanium nitride (TiN), titanium tungsten (TiW), tantalum (Ta), nickel chromium (NiCr), and nickel chromium silicon (NiCrSi).

15. The method of claim 9, wherein said phase-change material is selected from the group consisting of germanium telluride ($Ge_XTe_Y$), germanium antimony telluride ($Ge_XSb_YTe_Z$), germanium selenide ($Ge_ZSe_Y$) and any other chalcogenide.

16. The method of claim 9, wherein said chemically protective and thermally conductive layer prevents stringers at an edge of said PCM from coupling to said heating element.

* * * * *